(12) United States Patent
Shin

(10) Patent No.: US 6,190,946 B1
(45) Date of Patent: Feb. 20, 2001

(54) FABRICATING METHOD OF SEMICONDUCTOR PACKAGE

(75) Inventor: Myeong-Jin Shin, Chungcheongbuk-do (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/422,729

(22) Filed: Oct. 22, 1999

Related U.S. Application Data

(62) Division of application No. 08/986,146, filed on Dec. 8, 1997, now Pat. No. 5,994,772.

(30) Foreign Application Priority Data

Dec. 19, 1996 (KR) .................................................. 96/67949

(51) Int. Cl.$^7$ .................................................. H01L 21/44
(52) U.S. Cl. .......................... 438/123; 438/109; 438/111; 438/112
(58) Field of Search .................................... 438/107, 109, 438/111, 112, 121, 123, 124, 126, 127

(56) References Cited

U.S. PATENT DOCUMENTS

| | | | |
|---|---|---|---|
| 5,057,456 | * 10/1991 | Dehaine | 438/123 |
| 5,198,888 | * 3/1993 | Sugano et al. | 438/109 |
| 5,519,936 | * 5/1996 | Andros et al. | 438/124 |
| 5,756,377 | * 5/1998 | Ohsawa | 438/111 |
| 5,763,939 | * 6/1998 | Yamashita | 257/668 |
| 5,804,872 | * 9/1998 | Miyano et al. | 438/109 |
| 5,843,215 | * 12/1998 | Tsukagoshi et al. | 438/114 |
| 5,856,212 | * 1/1999 | Chun | 438/126 |

\* cited by examiner

Primary Examiner—Kevin M. Picardàt

(57) ABSTRACT

A method of forming a semiconductor package that includes at least one structure having a central hole formed at a center portion of the structure, a plurality of outer holes around the center hole, and a plurality of conductor pieces buried in the outer holes; at least one TAB having lead lines extending from sides of the TAB, the TAB having a configuration substantially corresponding to the central hole of the structure and formed over the central hole of the structure; and a molding material covering at least a portion of the TAB.

16 Claims, 7 Drawing Sheets

FABRICATING METHOD OF SEMICONDUCTOR PACKAGE

This application is a divisional of application Ser. No. 08/986,146, filed on Dec. 8, 1997, now U.S. Pat. No. 5,994,772, the entire contents of which are hereby incorporated by reference.

BACKGROUND OF THE INVENTION

1. Field of the Invention

The present invention relates to a semiconductor package and, more particularly, to a structure and a fabricating method of a semiconductor package, which is simple in the fabricating process and suitable for improving a reliability of a device.

2. Discussion of the Related Art

In fabrication of a semiconductor package, in general, successive steps of a process are conducted, including dicing for separating chips or integrated circuits fabricated on a wafer, chip bonding for setting the separated chips on paddles in a lead frame, wire bonding for electrically connecting bonding pads on the chips and inner leads of the lead frame, and molding the circuit for protection.

A conventional semiconductor package will be explained with reference to the attached drawing. FIG. 1 illustrates a sectional structure of a conventional wire bonding semiconductor package.

Referring to FIG. 1, the conventional semiconductor package includes a chip 11 with a built-in semiconductor circuit, a lead frame 12 connected to and for supporting the chip 11, a double sided adhesive tape 13 for fixing the chip 11 and the lead frame 12, lower pads 15 formed below the lead frame 12 for connecting a PCB (Printed Circuit Board) 14 and the lead frame 12, bonding pads 16 formed on upper portions of the chip 11 for acting as electrodes, wires 17 for electrically connecting of the boding pads 16 to the lead frame 12, and a body 18 of EMC (Epoxy Mold Compound) for protecting the device from external environment.

The aforementioned conventional semiconductor package has the following problems.

First, the wire boding process for electrical connection of the chip to the lead frame causes the fabrication process to be complicated and requires a complicated soldering process following the step of stacking the chips.

Second, no heat sinks are provided for dissipation of heat generated during the device operation such that electrical shorts or heating of the semiconductor device may occur.

Third, the conventional semiconductor package is configured such that the packages stacked up on top of each other do not appear very attractive and stable.

SUMMARY OF THE INVENTION

Accordingly, the present invention is directed to a structure and a fabricating method of a semiconductor package that substantially obviates one or more of the problems due to limitations and disadvantages of the related art.

An object of the present invention is to provide a method for fabricating a semiconductor package, which has simple in fabrication and easy in stacking.

Another object of the present invention is to provide a structure of a semiconductor package which has a heat sink attached thereon for ease of heat dissipation, that improves the reliability of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the structure of a semiconductor package includes a structure having conductor pieces each buried in one of holes opened through the structure in regular intervals, and a TAB having lead lines fixed at a fixture and extended in four directions each for electrical connection to one of the conductor pieces.

In another aspect of the present invention, there is provided a method for fabricating a semiconductor package including the steps of providing a structure according to a shape of a package, attaching lead lines on a fixture and extending in four directions to form a TAB, forming holes in regular intervals in the structure, burying a piece of conductor in each of the holes, reflowing the lead lines on the TAB for electrical connection of the lead lines to respective pieces of conductor and subsequent attachment of the lead lines to the structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Figure 1:
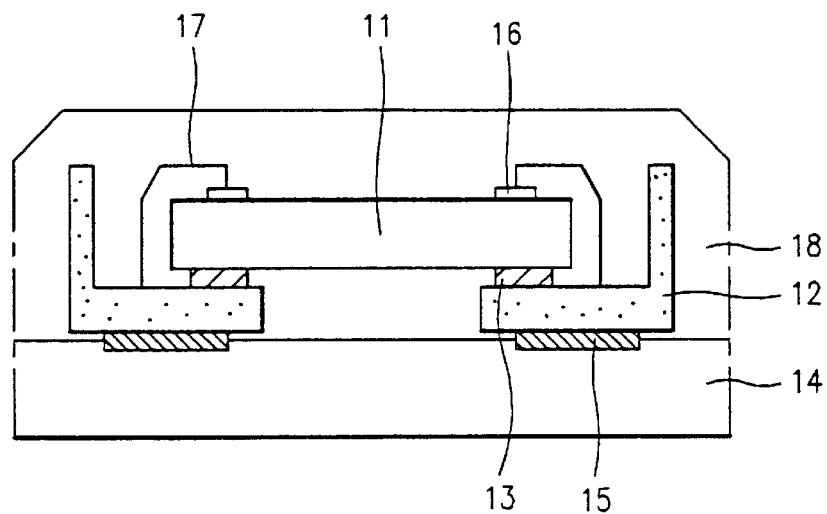
FIG. 1 illustrates a sectional structure of a conventional wire bonding semiconductor package.
Figure 2:
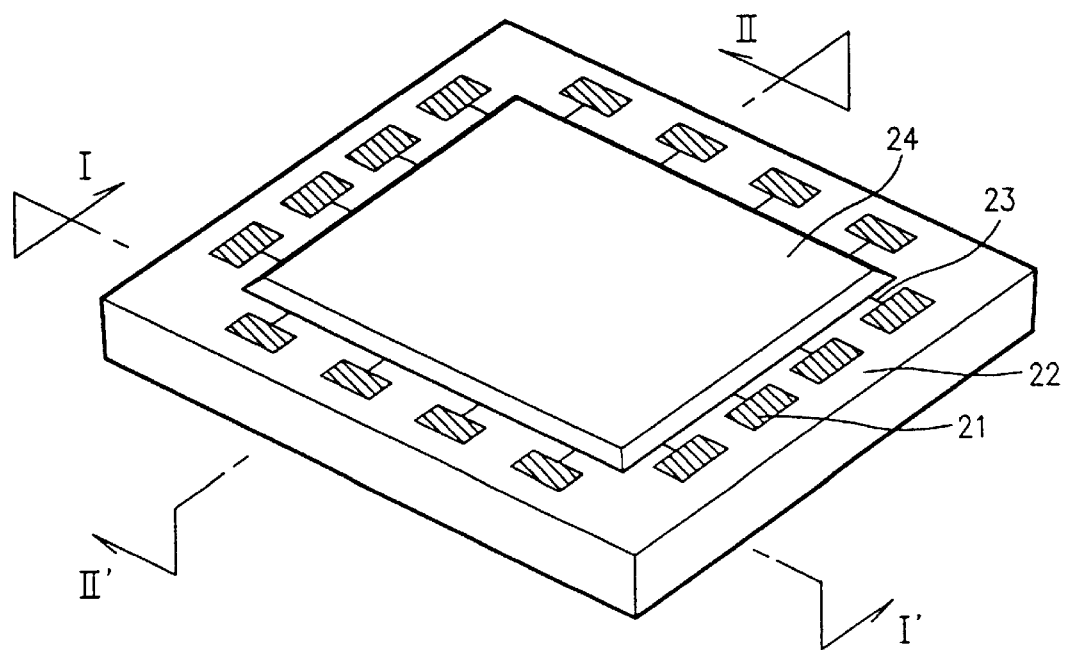
FIG. 2 illustrates a perspective view of a structure of a semiconductor package in accordance with a preferred embodiment of the present invention.

Reference will now be made in detail to the preferred embodiments of the present invention, examples of which are illustrated in the accompanying drawings. FIG. 2 illustrates a perspective view of a structure of a semiconductor package in accordance with a preferred embodiment of the present invention.

Referring to FIG. 2, the semiconductor package in accordance with the preferred embodiment of the present invention includes a structure 22 having conductor pieces 21 each buried in a through hole formed at regular intervals in the structure 22 in an up and down direction, a fixture for receiving lead lines 23 extended therefrom in different directions, and a TAB 24 having the lead lines 23 for electrical connection to the conductor pieces 21.

The structure 22 has a bottom plate for mounting chips thereon, wherein the bottom plate is formed either from a columnar structure of bottom plates provided in advance and only having the holes for burying the conductor pieces 21, which is sliced into pieces of unit bottom plates and grinded, or from a columnar structure of bottom plates provided in advance and having the holes for burying the conductor pieces 21 and through holes for mounting the chips, which is sliced into pieces of unit bottom plates for and attaching paddles thereto. The fixture may be a tape or other fastener for fixing the lead lines 23 thereto. Each lead line 23 and the corresponding conductor piece 21 buried in the structure 22 are electrically connected by bumps.

Figure 3A:
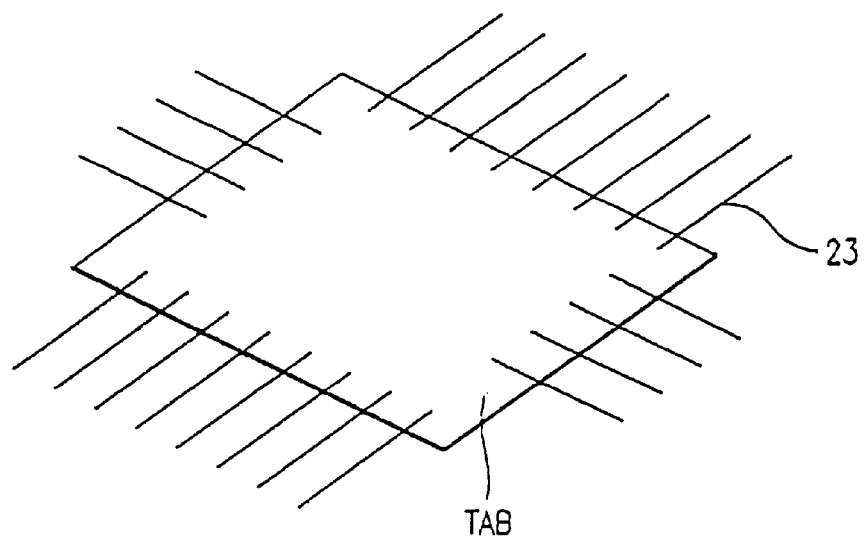
FIGS. 3a~3d illustrate perspective views showing the steps of a process for fabricating a semiconductor package in accordance with a preferred embodiment of the present invention.

FIGS. 3a–3d illustrate perspective views showing the steps of a process for fabricating a semiconductor package in accordance with the preferred embodiment of the present invention, wherein FIG. 3a shows a TAB having a plurality of lead lines 23 attached thereto and extending in at least four directions. Each of the lead lines 23 is electrically connected to one of the conductor pieces 21 to be formed later through bumps.

Figure 3B:
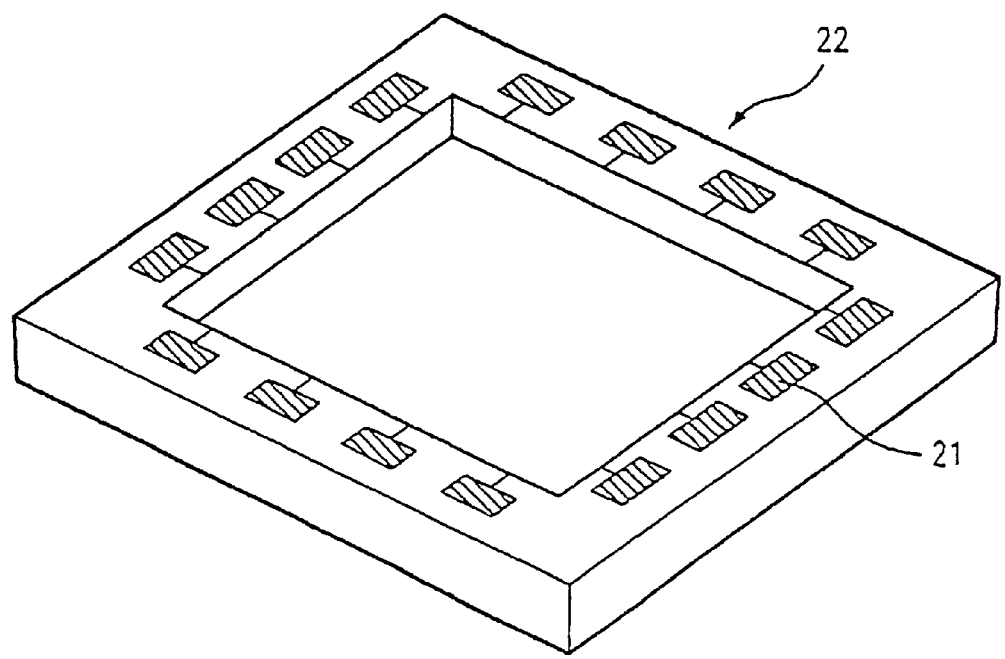

FIG. 3b shows a perspective view of the structure formed according to a shape of the package and having a recess formed at the center of the structure 22 and a plurality of holes formed in regular intervals in the structure 22 around the recess, wherein in each of the holes, one of the conductor pieces 21 is buried. With the attachment of the wafer chips and the TAB to the structure 22 having the buried conductor pieces 21, one completed package can be obtained.

Figure 3C:
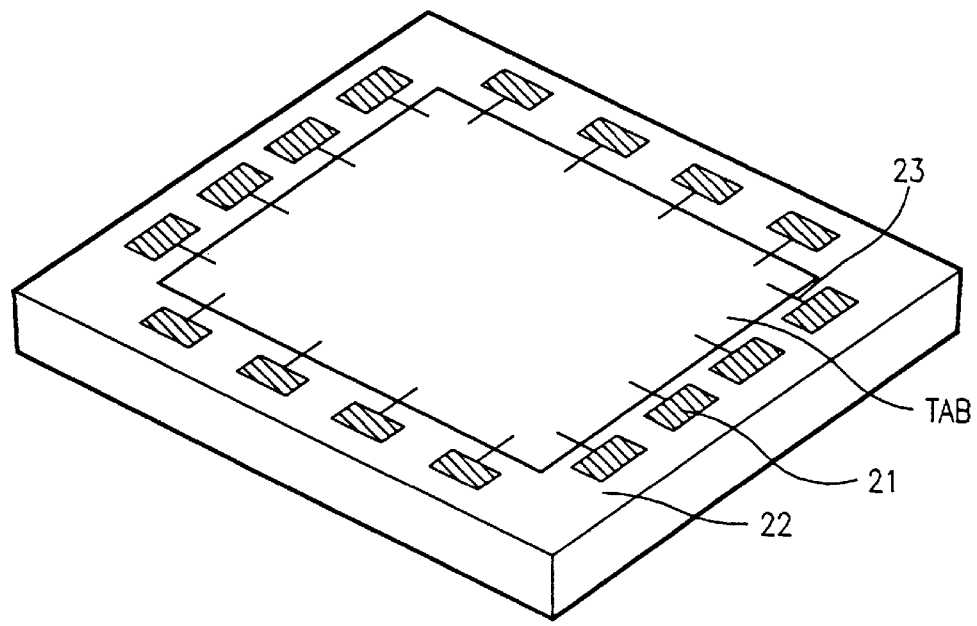

FIG. 3c illustrates a perspective view of the package having the wafer chips and the TAB attached to the structure 22. Each of the lead lines 23 attached to the TAB is electrically connected to one of the conductor pieces 21 buried in the structure 22.

Figure 3D:
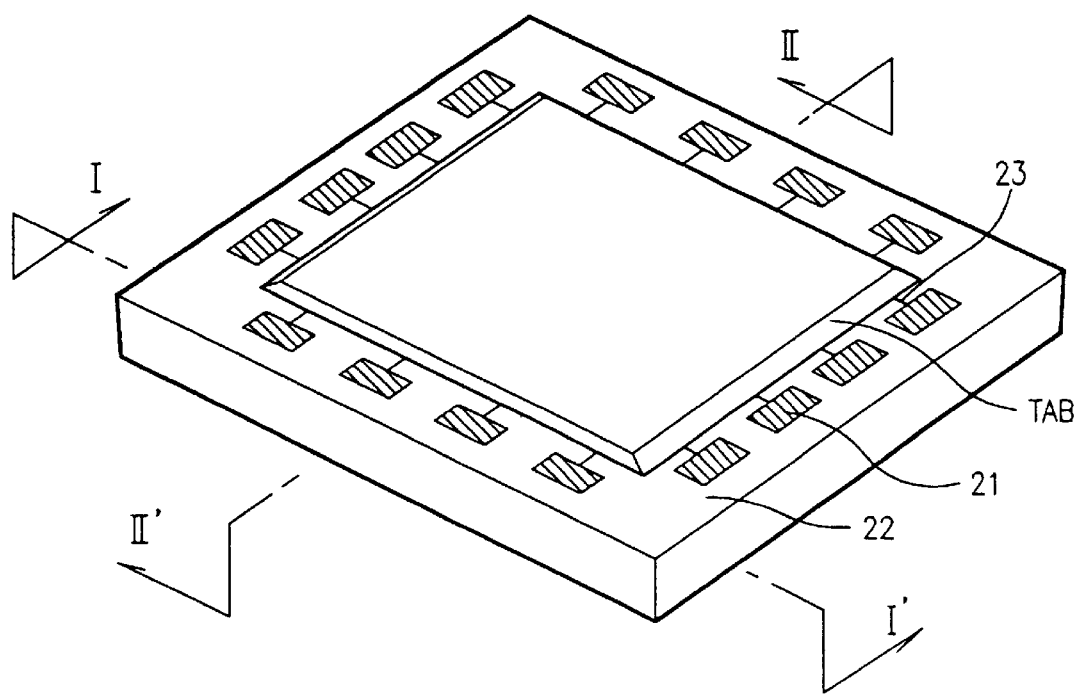

FIG. 3d illustrates a perspective view of a completed package after molding, according to the preferred embodiment of the present invention, top of the structure 22 can be molded, or the top of the TAB may be molded. In another example, the entire structure can be molded after mounting the structure 22 on an actual PCB. In this instant, to make an easy heat dissipation, a heat sink (not shown) or the like is attached on the TAB before the molding.

Figure 4A:
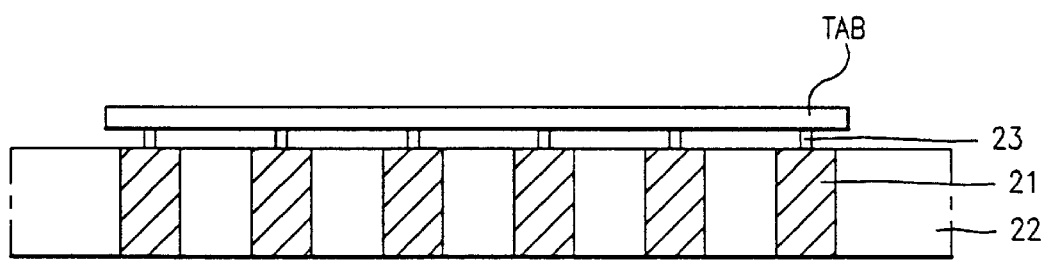
FIGS. 4a and 4b illustrate sections showing the semiconductor package across line I–I' in FIG. 3d.
Figure 4B:
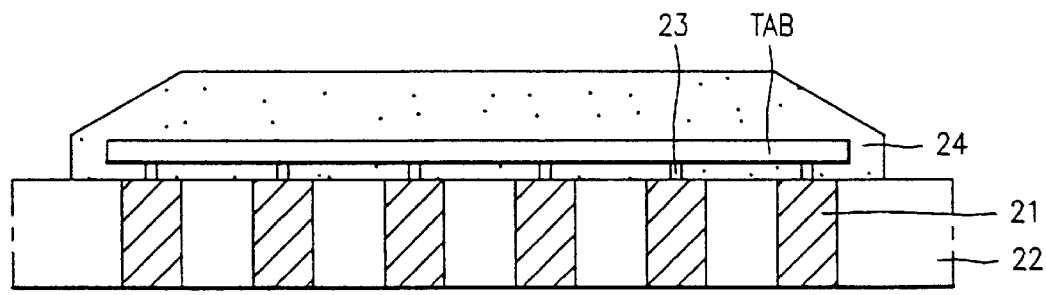

A method for fabricating such a semiconductor package will be explained with reference to sectional views. FIGS. 4a and 4b illustrate sectional views showing the semiconductor package across line I–I' in FIG. 3d.

Referring to FIG. 4a, a TAB is attached to a structure 22 such that a plurality of lead lines 23 are electrically connected to respective conductor pieces 21 buried in the structure 22. The spaces formed between the lead lines 23 are covered by the molding material in a molding process. FIG. 4b illustrates a sectional view of the semiconductor package after completion of the molding. As shown FIG. 4b, the molding is applied only to the upper part of the structure 22 using an epoxy resin 24.

Figure 5A:
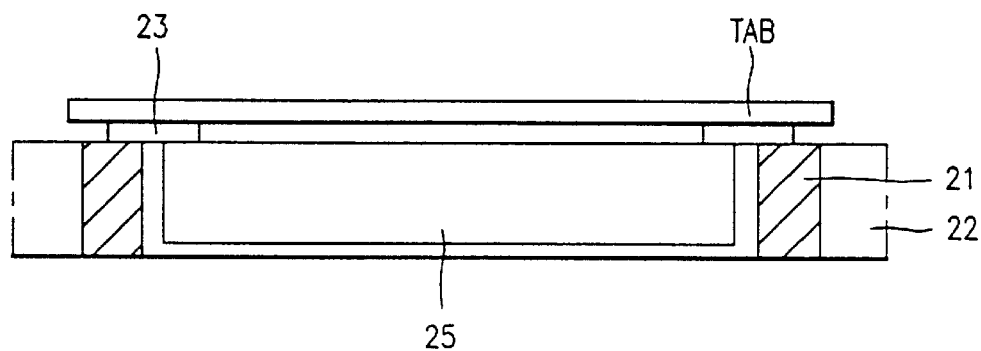
FIGS. 5a and 5b illustrate sections showing the semiconductor package across line II–II' in FIG. 3d.
Figure 5B:
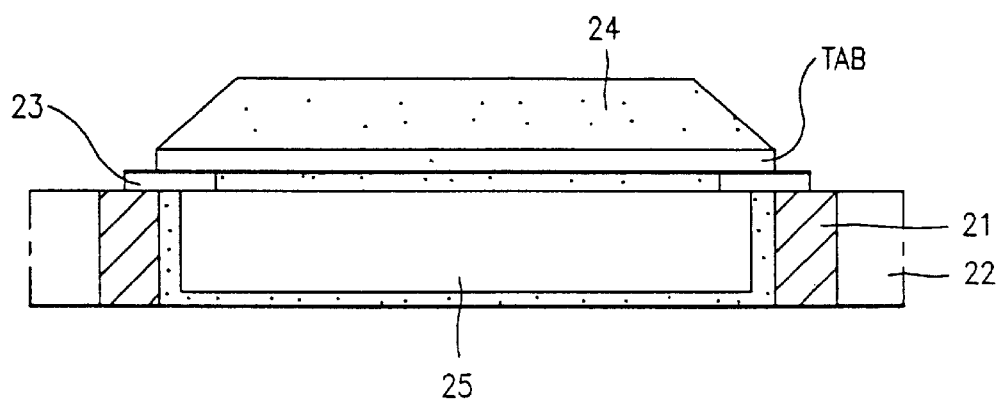

FIGS. 5a and 5b illustrate sectional views showing the semiconductor package across line II–II' in FIG. 3d.

Referring to FIG. 5a showing a sectional view of the completed package, the package including the conductor pieces 21 provided at the sides thereof, the wafer chip 25 formed within the structure 22, and the TAB having the lead lines 23 attached thereto on the structure 22. The lead lines 23 extend from the wafer chip 25 to the conductor pieces 21 on the sides of the wafer chip 25. A bump (not shown) provided on each conductor piece 21 electrically connects the conductor piece 21 and the corresponding lead line 23.

Referring to FIG. 5b showing a sectional view of the completed package after molding, the top of the structure 22 with the epoxy resin 24, the molding extending to the rim of the wafer chip 25 on the central portion of the structure 22.

The bumps provided on the conductor pieces 21 connected to the lead lines 23 of the TAB facilitate adhesion of the conductor pieces 21 and the lead lines 23 with ease using only the reflow process. In case such a semiconductor package is mounted on a PCB providing solder balls or bumps below the conductor pieces 21, the PCB and the package can be adhered to each other with ease.

Figure 6:
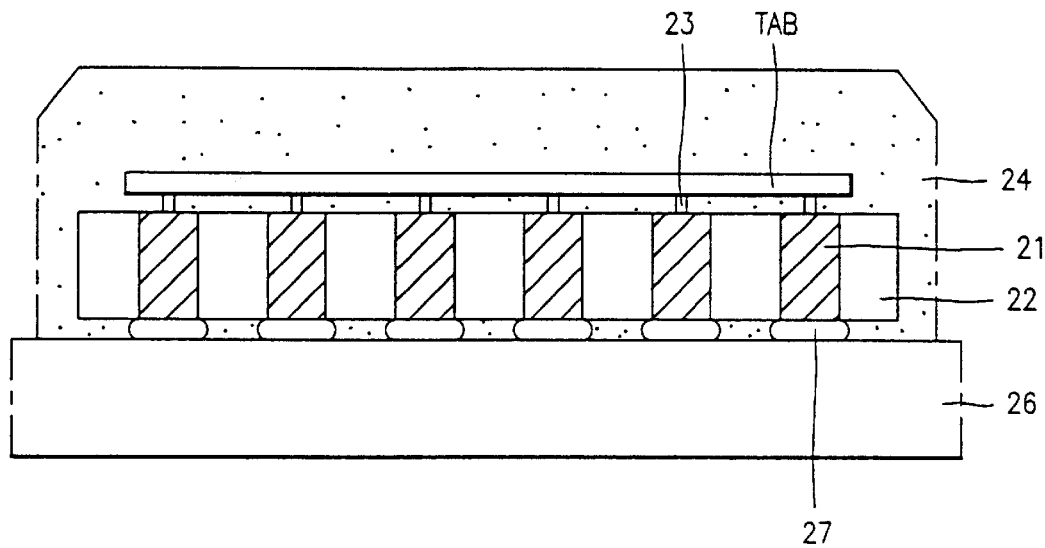
FIG. 6 illustrates a section of the semiconductor package mounted on a PCB according to the preferred embodiment of the present invention.

FIG. 6 illustrates a sectional view of the molded package adhered on the PCB 26, in which the solder balls 27 provided below the conductor pieces 21 can electrically connect the PCB 26 and the conductor pieces 21. Re-molding of the structure 22 to enclose the structure fully with the epoxy resin 24 after the adhesion of the package on the PCB 26 can further improve the package reliability.

The method for fabricating a semiconductor package explained above has a simple fabrication process because the wire bonding process for connecting the wafer chip and the conductor pieces is not required, and can improve usefulness because stacking is easy.

Figure 7:
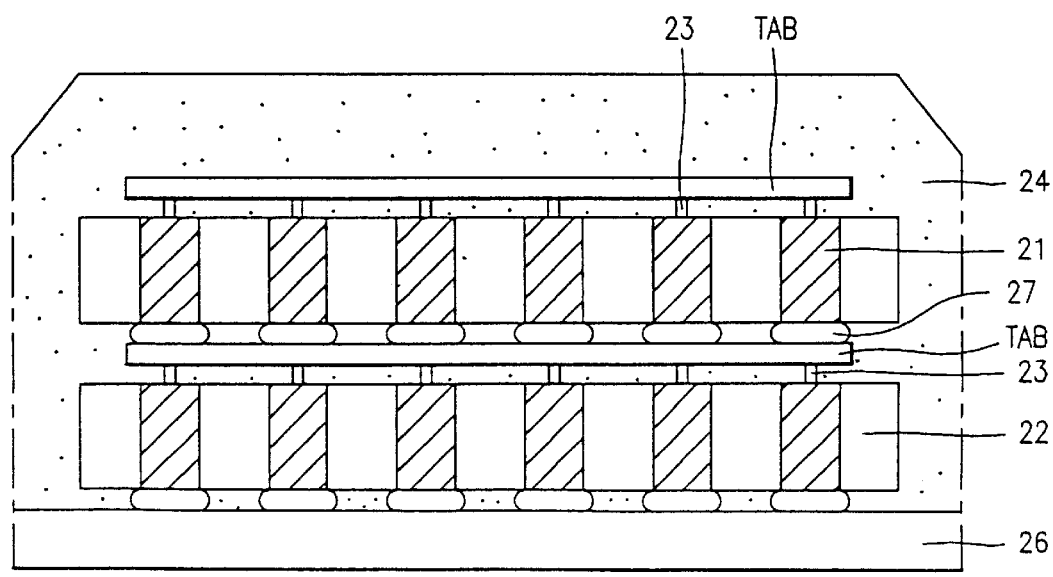
FIG. 7 illustrates a stacked section of the semiconductor packages in accordance with the preferred embodiment of the present invention; and, FIG. 8 illustrates a section of a semiconductor package having a heat sink attached thereto in accordance with another preferred embodiment of the present invention.

FIG. 7 illustrates a sectional view of the stacked semiconductor package in accordance with the preferred embodiment of the present invention.

Referring to FIG. 7, the packages are stacked after the solder balls 27 and the bumps 28 are provided thereto. Upon reflowing, the stacked packages can be adhered with ease. When molding the entire stacked packages with the epoxy resin 24 after mounting the stacked packages on the PCB 26, a capacity per actual unit package can be significantly increased because the stacked packages appear as one package. In this mounting of the stacked package on the PCB, the stacked packages and the PCB can be adhered with ease using only with a reflowing process with the solder balls 27 and the bumps 28.

Figure 8:
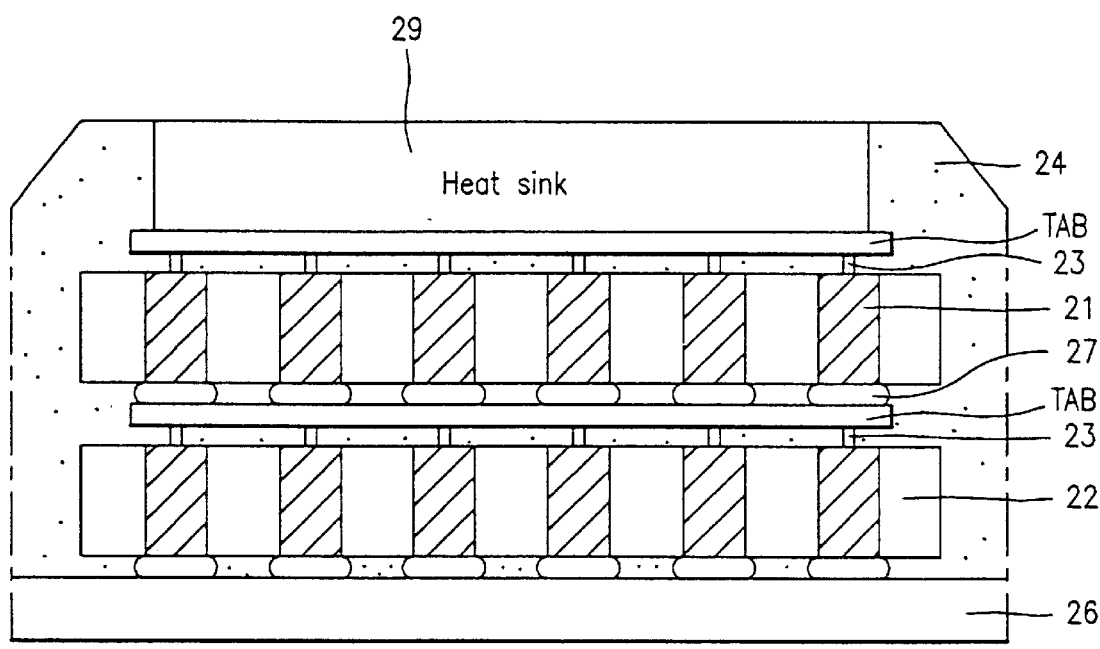

FIG. 8 illustrates a sectional view of the semiconductor package having a heat sink attached thereto for dissipation of heat according to the preferred embodiment of the present invention.

Referring to FIG. 8, in the method for fabricating the semiconductor package in accordance with the preferred embodiment of the present invention, after forming the heat sink 29 on the TAB of the top package, the entire semiconductor package formed by stacking the packages is molded with the epoxy resin 24.

The methods for fabricating a semiconductor package according to embodiments of the present invention explained above have the following advantages.

First, only an adhesion process for packaging the semiconductor structures is required, which facilitates a simple fabrication process because no wire bonding process is required.

Second, stacking of the packages can be performed using a simple reflow process without requiring any additional process steps.

Third, the simple attachment of the heat sink for enhancing heat dissipation improves of reliability of the semiconductor package.

It will be apparent to those skilled in the art that various modifications and variations can be made in the structure and fabricating method of a semiconductor package of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor package comprising the steps of:

providing a structure according to a shape of a package;

attaching lead lines on a fixture and extending in four directions to form a TAB;

forming holes in regular intervals in the structure;

burying a piece of conductor in each of the holes;

reflowing the lead lines on the TAB for electrical connection of the lead lines to respective pieces of conductor and attachment of the lead lines to the structure.

2. A method as claimed in claim 1, further comprising the step of molding the semiconductor package after attachment of the TAB to the structure.

3. A method as claimed in claim 2, further comprising the step of mounting the semiconductor package on a PCB after completion of molding.

4. A method as claimed in claim 3, wherein solder balls or bumps are formed on the PCB for connection of the conductor pieces to the PCB.

5. A method as claimed in claim 3, further including the step of molding the molded package again after mounting the molded package on the PCB.

6. A method as claimed in claim 1, wherein the TAB is attached on the structure and another package is stacked thereon.

7. A method as claimed in claim 6, wherein a stack of packages are electrically connected using solder balls or bumps in stacking of packages.

8. A method as claimed in claim 6, wherein a heat sink is attached on a top of the TAB in the package for dissipation of heat from the package completed on attachment of the TAB to the structure.

9. A method as claimed in claim 2, the molding is done on the upper part of the structure or the entire structure.

10. A method as claimed in claim 7, adhesion between packages in stacking of the packages is done by reflowing.

11. A method as claimed in claim 8, further including the step of molding the package again after attachment of the heat sink.

12. A method of fabricating a tape automated bonding (TAB) type semiconductor device, comprising:

forming a structure with a central opening, and a plurality of peripheral openings;

forming a plurality of conductors in the peripheral openings;

providing a cover with lead lines extending therefrom in different directions; and connecting the cover to the structure with the central opening having a semiconductor device therein, the lead lines and the conductors being electrically connected.

13. The method of claim 12, further comprising a step of forming a plate to support the semiconductor chip in the central opening.

14. The method of claim 12, further comprising a step of encapsulating the TAB type semiconductor device to form a package.

15. The method of claim 12, further comprising a step of stacking a plurality of TAB type semiconductor devices, the TAB type semiconductor devices being electrically connected therebetween.

16. The method of claim 12, further comprising a step of attaching a heat sink.

\* \* \* \* \*